(12) United States Patent
Cai et al.

(10) Patent No.: US 10,648,624 B2
(45) Date of Patent: May 12, 2020

(54) FILAMENT LED LAMP

(71) Applicant: Eye Lighting International of North America, Inc., Mentor, OH (US)

(72) Inventors: Dengke Cai, Willoughby, OH (US); Paul J. Jurkovic, Painesville, OH (US); Thomas G. Salpietra, Denver, NC (US); Paul F. Smetona, Pepper Pike, OH (US); Seth B. Bullock, Cleveland, OH (US)

(73) Assignee: Eye Lighting International of North America, Inc., Mentor, OH (US)

( * ) Notice: Subject to any disclaimer, the term of this patent is extended or adjusted under 35 U.S.C. 154(b) by 197 days.

(21) Appl. No.: 15/966,543

(22) Filed: Apr. 30, 2018

(65) Prior Publication Data

US 2019/0331302 A1    Oct. 31, 2019

(51) Int. Cl.
    *F21K 9/232*     (2016.01)
    *H01L 33/34*     (2010.01)
    *F21V 29/70*     (2015.01)
    *F21Y 115/10*    (2016.01)

(52) U.S. Cl.
    CPC .............. *F21K 9/232* (2016.08); *F21V 29/70* (2015.01); *H01L 33/346* (2013.01); *F21Y 2115/10* (2016.08)

(58) Field of Classification Search
    CPC . F21K 9/23; F21K 9/232; F21K 9/237; F21K 9/27; F21K 9/275
    See application file for complete search history.

(56) References Cited

U.S. PATENT DOCUMENTS

| 9,803,848 | B2 * | 10/2017 | Van Hout | F21V 3/061 |
| 2014/0268771 | A1 * | 9/2014 | Heikman | F21V 29/004 |
| | | | | 362/249.02 |
| 2018/0347802 | A1 * | 12/2018 | Fu | F21V 29/73 |

* cited by examiner

*Primary Examiner* — Karabi Guharay
*Assistant Examiner* — Steven Y Horikoshi
(74) *Attorney, Agent, or Firm* — Tucker Ellis LLP; Heather M. Barnes (57) ABSTRACT

A high output lamp is made with LED filaments (i.e., LED chips mounted on a long narrow substrate and encapsulated in silicone). High output is enabled by structurally minimizing thermal resistance between filaments and bulb. The bulb is generally tubular and contains a mount structure with longitudinally extended LED filaments electrically and mechanically connected between ring or disc shaped end connectors, and spaced apart around the structure's perimeter. An outer surface of the LED filaments defines a mount structure perimeter that is held adjacent to an inner surface of the bulb, separated by a total diameter difference gap of substantially zero to three millimeters maximum. End connectors may have a cut out portion enabling resiliently compressible diameter. The bulb may be filled with pure helium, or pure hydrogen, or a mixture of the two. A contaminant cleaner inside the bulb may be an oxygen dispenser.

20 Claims, 6 Drawing Sheets

FIG. 4C
SECTION C-C

FILAMENT LED LAMP

TECHNICAL FIELD OF THE INVENTION

The present invention relates to light emitting diode (LED) light sources and, more particularly, to such light sources incorporating LED filaments.

BACKGROUND OF THE INVENTION

The term "filament LED" (or "LED filament") is an industry accepted name seen, for example, in magazine articles and online discussions about a type of chip on board or glass (COB or COG) LED light source typically comprising many (sometimes hundreds) of tiny unpackaged LED chips wire-bonded as a closely spaced string on a long narrow and thin substrate. For the low power filament LEDs typical to date, this configuration has avoided the need for massive heat sinks by use of helium gas filling to enhance heat transport to the bulb by convection and conduction of the cooling gas.

Figure 1:
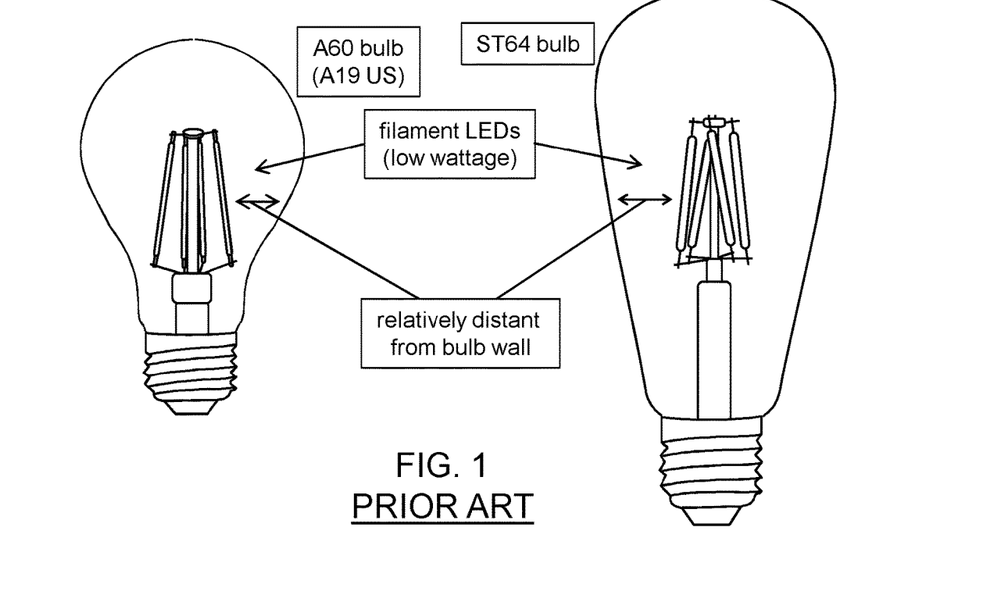
FIG. 1 shows examples of prior art lamps that use filament LEDs as a light source.

FIG. 1 shows examples of prior art Osram lamps (~4 W, 220V in A60 and ST64 bulbs) that use filament LEDs as a light source, as shown and described in the SOLERIQ® L38 Reference Design document (Osram Opto Semiconductor GmbH). Each example has four L38 filament LEDs, arranged as two series-connected pairs of parallel-connected LED filaments. This provides an axially extended light source arranged around the central lamp axis although individual filaments are typically not parallel to the axis (not axially aligned). The lamps have a fused glass seal in the neck and are ~90% He filled to cool the LEDs by heat transfer to the bulb, which is relatively distant from the filament LEDs, as shown. In the SOLERIQ L38 Application Guide, "suitable lamp types" are listed as: A17-A19 (US)/ A55-A60 (metric); ST64 (metric); C35 (metric); and G25-G40 (US). Thus the suggested bulb shapes all have vertically/longitudinally curved sides (diameter varies with longitudinal distance/height/length from the lamp base).

Figures 2, 3:
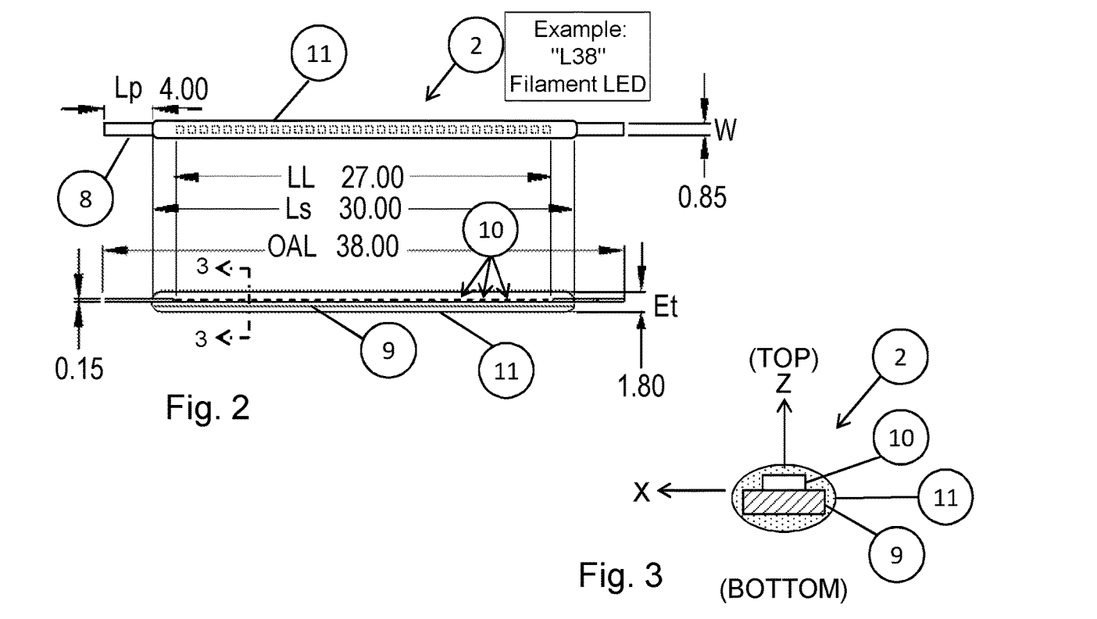
FIGS. 2-3 are top, side, and section view schematic drawings of a filament LED according to manufacturer's documentation, FIG. 3 being a section taken along line 3-3 in FIG. 2.

FIGS. 2-3 show an example schematic representation of an L38 filament LED (drawing reference number 2) with a plurality, e.g., thirty-two, of sapphire LED chips 10 connected in a linear array between anode and cathode electrical connection pins 8 (e.g., flattened metal tabs). The chips are mounted on a relatively long and narrow (e.g., 30.00×0.85 mm), rigid (e.g., aluminum) substrate 9 and the entire chip array is encapsulated in a coating of silicone 11 which has the LED phosphor mixed into it for transforming the LED output into "white" light. As shown, the light emitting chips are mounted on a "top" side of an opaque substrate, therefor most of the radiant power is emitted "outward" from the "top" side of the filament 2, i.e., generally in the "Z" direction.

Obviously for an opaque substrate, the coating 11 of silicone with phosphor is only needed on the top side, however it is known to use chip on glass (COG) technology wherein the LED chips are mounted on a light transmitting substrate such as glass and sapphire material, in which case the phosphor is also needed on the bottom side.

The SOLERIQ Application Guide recommends helium lamp fill gas to optimize LED cooling because, according to their tests: "Due to the better thermal conductivity of helium, the filament runs at a lower Tj [junction temperature]. Tj of filament LED in air is ~1.7 times higher than in helium."

The Application Guide lists example lamp configurations ranging from two to eight L38 filament LEDs to output lumen equivalents of 25 W to 60 W incandescent lamps.

It is an object of the inventive work disclosed hereinbelow to achieve much higher light output from a lamp, for example a lamp having the equivalent of eighteen SOLERIQ L38 filaments in a single bulb. This quantity can be expected to generate more than two times the amount of heat as an eight-filament lamp, therefor improved means of cooling the LEDs is a further objective of this inventive work.

BRIEF SUMMARY OF THE INVENTION

According to the invention a high output lamp is made with LED filaments (i.e., LED chips mounted on a long narrow substrate and encapsulated in silicone that protrudes outwardly of the LED chips to an outer surface), wherein high output is enabled by structurally minimizing thermal resistance between filaments and bulb. The bulb is generally tubular and longitudinally extended. It contains a mount structure with longitudinally extended LED filaments that are electrically and mechanically connected between longitudinally separated end connectors, and spaced apart around the structure's perimeter. The outer surface of the LED filaments is held adjacent to an inner surface of the bulb, separated by a gap of substantially zero to three millimeters maximum. The bulb, which may be hermetically sealed, is filled with a high cooling rate gas of pure helium, or pure hydrogen, or a mixture of the two. A contaminant cleaner sealed inside the bulb is an oxygen dispenser configured to emit oxygen gas when heated above a triggering temperature. Preferably the LED chips face radially outward, thereby minimizing the distance between the bulb wall and the heat generating emitters of the LED chips. Preferably the filaments are axially aligned so that they don't have to bend to be adjacent to the glass along the whole lighted length.

According to the invention LED filaments are mounted in a lamp directly (physically) touching the glass jacket/bulb internal surface, or as close to touching as possible, meaning no more than 3 mm separation anywhere along the lighted length of the filament, preferably less than 2 mm, more preferably less than 1 mm, most preferably substantially zero. This is significantly different than prior art filament LED lamps, since we structurally minimize the thermal resistance between LEDs and heat sinking outer jacket/bulb by holding them in much closer proximity.

According to the invention the end connectors are ring or disc shaped. They may be resiliently flexible and/or have a cut out portion of its perimeter for enabling resiliently compressible diameter, thereby enabling adjustment for variations in the bulb ID (either overall or surface irregularities), and to ease insertion of the mount structure as it is pushed into the bulb. Use of a resilient material will provide a diameter-increasing bias force such that the end connector could be compressed/constricted to a smaller mount diameter for easy insertion into the bulb followed by allowing the end connectors to expand until the LED filaments are all touching the bulb wall. If the end connector's uncompressed diameter is made slightly oversize, i.e., greater than the nominal bulb ID, then a zero dimension gap could be assured for all bulb ID variations within expected tolerances.

Lubrication (e.g., silicone oil, or other such material that may also be used as a thermally conductive transitional component) may be used to reduce friction and also to fill gaps due to bulb ID variation.

According to the invention, the top end connector is substantially supported by a rigid support rod extending up from a stem. The bottom end connector is preferably more flexibly connected to the stem. This arrangement eases pushing the mount structure into the bulb even when close proximity causes frictional drag on the filament encapsulant. The firm top connection and rigid support rod are used to push on the mount's top end which is above the friction points, so the ring of filaments is effectively pulled up into the bulb, with the bottom end self centering regardless of stem centering. The force of pushing (or twisting) the end connector can be used to cause diameter compression (e.g., pushing on rod-to-ring connecting wires or on the disc center, bends them upward which shortens the radial distance to the end connector perimeter).

According to the invention, LED deterioration in a sealed bulb is controlled by use of at least one contaminant cleaner inside the bulb such as an oxygen dispenser configured to emit oxygen gas when heated above a triggering temperature. Preferably an absorption getter is also included. Preferably the cleaner(s), especially the oxygen dispenser, are mounted where it will be heated above its trigger temperature by the LEDs when operating, but not by the heat from forming the fused glass lamp seal (which occurs before evacuation, flushing and gas filling). For example, the cleaner(s) are located at the top of the lamp, farthest away from the base end sealing area, and generally where it will be heated by conductive and convective thermal transfer from operating LEDs. A heat shield may be used to further block heat from the sealing process.

Further according to the invention, silicone LED encapsulant may be physically and/or chemically bonded with the glass to maximize thermal conductivity. This would also minimize Fresnel loss. Chemical bonding may be accomplished by: oxygen plasma treating the glass before placing the silicone encapsulated LED filaments in contact with the treated glass surface. By the heat from a fused glass sealing process, filament LEDs will be bonded chemically with the glass. Alternatively, by applying uncured silicone on at least the radially outward surface of the filament LEDs after they are attached to the mounting/support structure, and then curing the silicone coating, for example by heat from a lamp sealing process, or by UV, or by other thermal or radiation processes.

Further according to the invention, an LED driver may be provided in a base on the bottom end of the lamp. Alternatively, an LED driver may be provided inside the bulb, for example attached to the mount structure such as the stem or an end connector.

Other objects, features and advantages of the invention will become apparent in light of the following description thereof.

BRIEF DESCRIPTION OF THE DRAWINGS

Reference will be made in detail to preferred embodiments of the invention, examples of which are illustrated in the accompanying drawing figures. The figures are intended to be illustrative, not limiting. Although the invention is generally described in the context of these preferred embodiments, it should be understood that it is not intended to limit the spirit and scope of the invention to these particular embodiments.

Certain elements in selected ones of the drawings may be illustrated not-to-scale, for illustrative clarity. The cross-sectional views, if any, presented herein may be in the form of "slices", or "near-sighted" cross-sectional views, omitting certain background lines which would otherwise be visible in a true cross-sectional view, for illustrative clarity.

Elements of the figures can be numbered such that similar (including identical) elements may be referred to with similar numbers in a single drawing. For example, each of a plurality of elements collectively referred to as 199 may be referred to individually as 199a, 199b, 199c, etc. Or, related but modified elements may have the same number but are distinguished by primes. For example, 109, 109', and 109" are three different versions of an element 109 which are similar or related in some way but are separately referenced for the purpose of describing modifications to the parent element (109). Such relationships, if any, between similar elements in the same or different figures will become apparent throughout the specification, including, if applicable, in the claims and abstract.

The structure, operation, and advantages of the present preferred embodiment of the invention will become further apparent upon consideration of the following description taken in conjunction with the accompanying drawings, wherein.

DETAILED DESCRIPTION OF THE INVENTION

The following table is a glossary of terms and definitions, particularly listing drawing reference numbers or symbols and associated names of elements, features and aspects of the invention(s) disclosed herein.

| REF. | TERMS AND DEFINITIONS |
|---|---|
| 1 | End connector part of mount structure for LED filaments. Embodiments for two types are illustrated: |
| (1a) | =disc. |
| (1b) | =ring. May be wire or band/strip of a conductor formed into a circle or other shape suitable for positioning filament LEDs adjacent to bulb/jacket 5 (inner wall) |
| 2 | Filament LED or LED filament, also LED string or strip: e.g., "Chip On Board" type of LEDs. Generally obtained as a complete assembly of LED chips 10 mounted (e.g., wire bonded) on a substrate 9 and electrically interconnected between end pins 8. The LED chips (and at least top of the substrate) are collectively covered by a silicone encapsulant 11 that typically contains a suitable LED phosphor. Substrate may be opaque metal (e.g., aluminum) or light transmitting material (e.g., glass, sapphire). |
| 3 | Positive connecting wire, '+' connector. Conducts LED driver controlled DC current to |

| REF. | TERMS AND DEFINITIONS |
|---|---|
| | anode end of filament LED. May be labeled by a plus sign in drawings (+). |
| 4 | Negative connecting wire, '−' connector. Conducts LED driver controlled DC current to cathode end of filament LED. May be labeled by a minus sign in drawings (−). |
| 5 | Jacket/bulb/envelope of lamp, outer jacket. May be a T-bulb, i.e., tubular (cylindrical). |
| 6 | Stem for fused glass hermetic sealing of end of bulb 5. Generally has a flared bottom that is fused to neck/base end of bulb to make a seal 20, an exhaust tube, and lead wires 14 configured to sealingly pass through a fused glass "press" at the top of the stem. Is part of mount structure that may include connecting and/or support wire(s), and/or a support rod. |
| 7 | Base of lamp. Two embodiments illustrated: |
| (7a) | =Edison screw cap, for application over fused glass seal area (hermetically sealed lamp) |
| (7b) | =Collar or closed end cap (e.g., plastic) with adhesive (e.g., silicone) attachment to open neck end of bulb. Collar/cap may have a screw cap base attached to it, or may have other provisions for electrical/mechanical connection to a lamp socket, holder, or the like (not shown). |
| 8 | Pin (anode or cathode) = connection tab at ends of filament LED assembly 2. May be bent for electrical (and mechanical) attachment (e.g., welded) to end connector 1. |
| 9 | Substrate for mounting LED chips 10 in the filament LED strip 2. Generally a long narrow and thin rectangular shape, only slightly flexible, e.g., PCA material suitable for direct mounting of LED chips. It may be an opaque metal (e.g., aluminum) or a light transmitting material (e.g., glass, sapphire). |
| 10 | Individual LED (chip) in filament LED 2. |
| 11 | Encapsulant covering LED chips 10 = silicone with phosphor in it for establishing a desired output spectrum, e.g., visible light in the 2700 K color temperature range. |
| 12 | Gap, separation space (3 dimensional) between LED encapsulant 11 and inside surface of lamp jacket 5. Thickness of this area (gap dimension "G" = spacing/separation distance between 11 and 5) is as small as possible, preferably zero (physical contact). Optionally filled with a transitional component 25 to optimize contact and provide benefits such as improved thermal conductivity, and/or optical benefits such as reducing refraction and reflection (e.g., Fresnel loss). |
| 13 | Tier of filament LEDs 2. Plurality of LED strips connected in parallel between electrically conductive end connectors 1. |
| 14 | Lamp lead wires electrically connected to power via base contacts (e.g., embedded in stem 6 of a fused glass seal embodiment). The power to the lamp may be DC from an external LED driver, or may be AC line voltage directed to an LED driver 19 built into the lamp. |
| 16 | Contaminant cleaners inside lamp jacket, used to minimize damage to components due to contaminants inside finished and operating lamp. Cleaners (often called getters) are positioned for activation by heat from LED operation but not from lampmaking process (e.g., hermetic sealing) Two embodiments illustrated: |
| (16a) | =absorption getters for sorbing and holding active gases such as Oxygen, Carbon Dioxide/Monoxide, Water, and Hydrocarbons such as VOCs (volatile organic compounds). E.g., a porous package (bag, metal tablet) holding zeolites, desiccant, special getter alloy, etc. |
| (16b) | =Oxygen dispenser (a particular type of active chemical getter): e.g., metal flag holding an oxide that emits oxygen gas when heated above a triggering temperature by LED operation. The oxygen reacts with organics to produce COx which can be sorbed by the absorption getter 16a. |
| 17 | Lamp fill gas: preferably pure He, optionally H2 or a mix of He/H2 (for hermetically sealed lamps). |
| 18 | Lamp, Filament LED Lamp. Typically single ended with a base 7 at the "bottom" end, and a closed end of the bulb 5 at the "top". |
| 19 | Driver for LEDs of lamp 18 (optionally external, but preferably built into lamp finished with a base) |
| 20 | Lamp sealing area or seal: e.g., fused glass hermetic seal |
| 21 | Support wire part of mount structure 24 that holds internal components of the lamp, e.g., end connector 1, contaminant cleaner 16. |
| 22 | Support rod (optional) part of mount structure 24, e.g., a glass rod or tube extending up from the stem 6, or e.g., a stiff wire rod. In general, rigid connector, preferably suitable for pushing the mount structure into the bulb. |
| 23 | Heat shield between base/fused glass seal area and filament LEDs, e.g., clipped onto stem press. Optional but preferred for fused glass hermetically sealed lamp embodiments, especially if hard glass is used. |
| 24 | Mount structure, structural assembly of components inside the bulb 5, e.g., any of: filament LEDs 2, contaminant cleaner(s) 16, heat shield 23, connecting wires 3, 4; and elements that hold the filament LEDs in operational position: e.g., any of: end connectors 1, stem 6, support rod 22, support wires 21. |
| 25 | Transitional component, thermally conductive material to fill space 12 between bulb wall and filament LED encapsulant 11, e.g., silicone oil. |
| 26 | Cut-out portion of end connector 1. Enables variable diameter D of filament LED mount structure. |
| G | Gap dimension/thickness of separation space 12 between LED encapsulant 11 and inside surface/wall of lamp bulb/jacket 5. Dimension G of this area is as small as possible, i.e., no more than 3 mm, most preferably substantially zero everywhere. |
| LCL | Light center length of lamp |
| OAL | Overall length (of lamp, or of filament LED) |
| Et | Thickness of filament LED encapsulant 11 |
| Lp | Length of pin 8 |
| W | Width of substrate 9 |
| LL | Lighted length of combined LED chips 10 |
| Ls | Length of substrate 9 |
| D, D' | Mount structure diameter: outside diameter of cylindrically arranged (ring of) filament LEDs 2, measured to the outward extent of the encapsulant 11 that covers the LED chips 10 and protrudes outwardly. This diameter is determined by the dimensions of the end connector 1, which may be compressible to a smaller compressed diameter D' to ease insertion of the mount structure 24 into the bulb. |
| ID | Inside diameter of the bulb wall 5 |

The invention(s) will now be described with reference to the drawings using the reference numbers and symbols listed in the above table.

The filament LED lamp 18 may be characterized as follows:

It is an LED lamp using "filament" LEDs 2 for its light source, and is designed for "high output" lighting (e.g., greater than 2000 lumens from a single lamp), therefore improvements are implemented to provide adequate LED cooling.

An advantage of a high output LED lamp 18 made using filament LED strings 2 is that it is can be lighter weight than lamps having large arrays of discrete LEDs mounted on MCPCB backplanes (metal core printed circuit board), or in LED modules with bulky heat sink structures.

Filament LEDs

Referring particularly to FIGS. 2 and 3, the background section hereinabove generally describes the LED light source designated herein as a filament LED (or LED filament) 2. Either term may be used, and may also be referenced simply as the "filament" 2. Focusing on its aspects relevant to the invention, the LED filament 2 is an elongated narrow substrate 9 with a plurality of closely spaced, relatively small interconnected LEDs 10 (typically unpackaged LED chips) mounted on a "top" side of the substrate 9 and encapsulated in a phosphor-containing silicone material 11 that generally covers the plurality of LED chips 10 as a group on at least the top side of the filament 2, and forming an outer surface for it. As shown in FIG. 3, the LEDs 10 face "outward" from the top to emit radiation generally outward in the Z direction. The substrate 9 is "elongated" and "narrow" in the sense of being much longer than its width, and having a surface area that is minimally large enough to mount the plurality of LED chips 10 in a long tightly packed string.

When an opaque substrate 9 is used the encapsulant 11 may cover just the top side of it, but optionally may also cover the "bottom" side as a matter of manufacturing convenience (e.g., for dip coating). Alternatively, for light transmitting substrates 9 the encapsulant 11 preferably covers both top and bottom sides. (Top/bottom designations are defined in FIG. 3 for references to the LED chip 10 mounted on the substrate 9, however top/bottom designations relative to the lamp 18 are independently defined as will become clear in the context of description.)

Higher Output

Lumen output of a filament LED lamp may be increased by increasing power and/or quantity of the LEDs. The string of LED chips 10 may be lengthened by lengthening the substrate 9 and/or by adding LED filaments 2, which may be combined in parallel or series electrical connections.

The prior art lamps (e.g., FIG. 1) generally have only a few widely spaced LED filaments centered in a relatively large bulb volume, such that heat must be transported over relatively large distances for LED cooling. The distance reduces the thermal conduction rate and increases reliance on convection. Therefor cooling can be adequate only when the total power is relatively low, which means low (radiant) output (e.g., a few hundred lumens).

For the inventive filament LED lamps 18 we obtain a "high" output, even in relatively small bulb volumes, by using many more LED filaments 2 and/or more LED chips 10 in each LED filament 2, thus requiring more dense arrangements to keep to a reasonable bulb size, and this in turn means that LED cooling must be enhanced, i.e., improved with respect to the prior art.

Figure 7A:
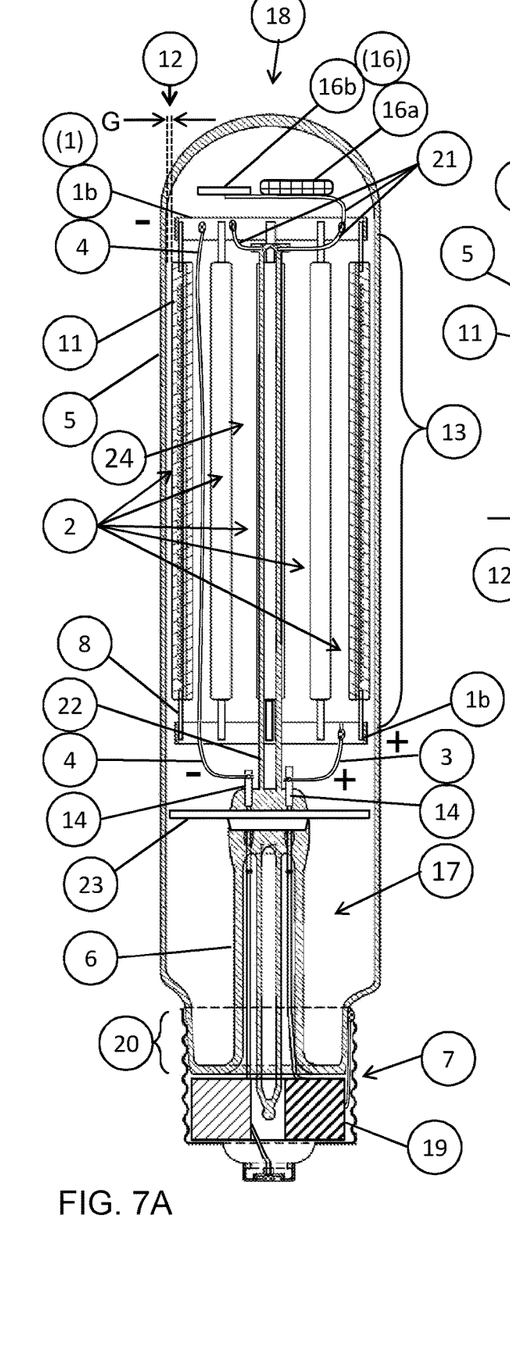
FIG. 7A is a side sectional view of a second embodiment of a filament LED lamp, having a ring type of end connector, according to the present invention.
Figure 7B:
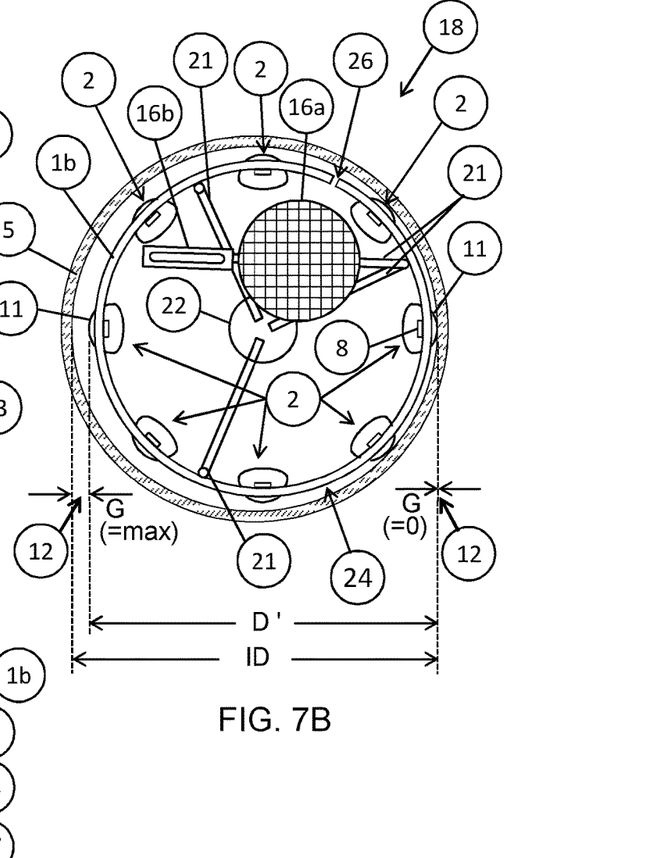
FIGS. 7B and 7C are top sectional views of the second embodiment showing compressed and expanded diameters, respectively, of the end connector ring, according to the present invention.
Figure 7C:
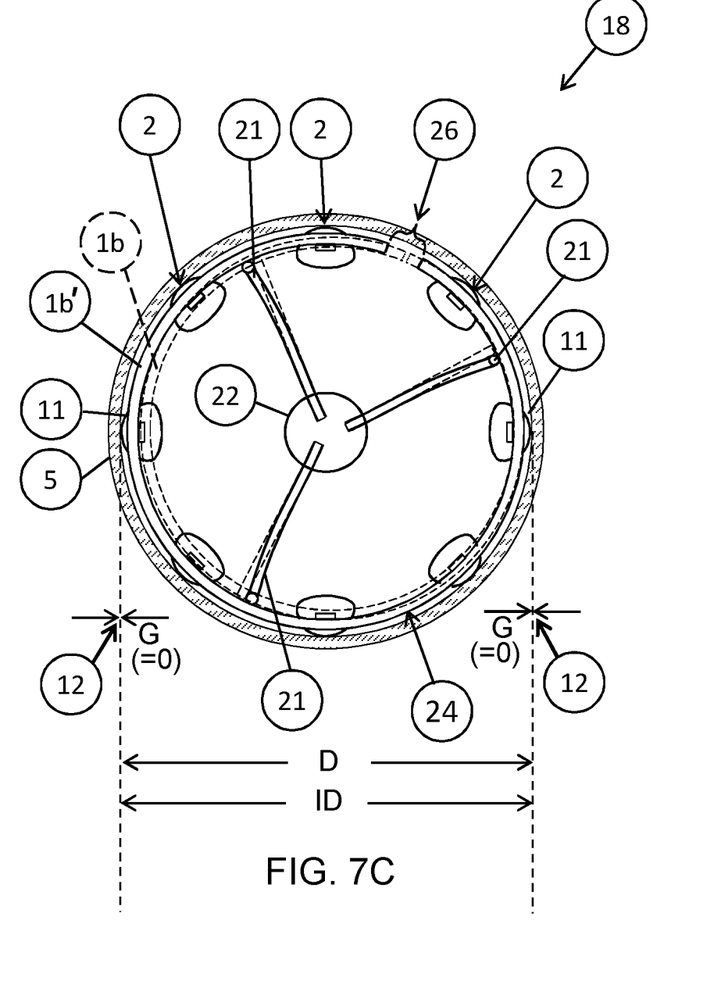

For example, an embodiment of our high output lamp 18 (e.g., see FIG. 5) may use eighteen of the SOLERIQ L38 filaments 2 in three stacked tiers 13, totaling 23 W (watts) and 2500 lm (lumens) in a T-37.5 mm bulb 5. Alternatively, the eighteen L38 filaments could be packed together around the perimeter of a single tier (making them more closely spaced). Another potential embodiment has a single tier of 48 closely spaced LED filaments. Another embodiment of our high output lamp 18 (e.g., as shown in FIGS. 7A-7C), uses larger, higher output LED filaments 2, each comprising, for example, a wider and longer substrate strip 9 (W×Ls=5 mm×120 mm) having one hundred LED chips 10 in two densely packed rows of fifty, instead of the single row of thirty-two chips in the SOLERIQ L38 filament (0.85 mm×30 mm substrate). Use of these longer LED filaments enables the same output power (e.g., 23 W) from only 8-10 filaments, but with more effective heat dissipation because they are more widely spaced apart around the perimeter. Advantageously, the higher output LED filaments are more energy efficient, so that lumen output is increased for the same power (e.g., 3200 lm), and less of the total power goes into heat that must be dissipated.

Enhanced Cooling

Figure 4A:
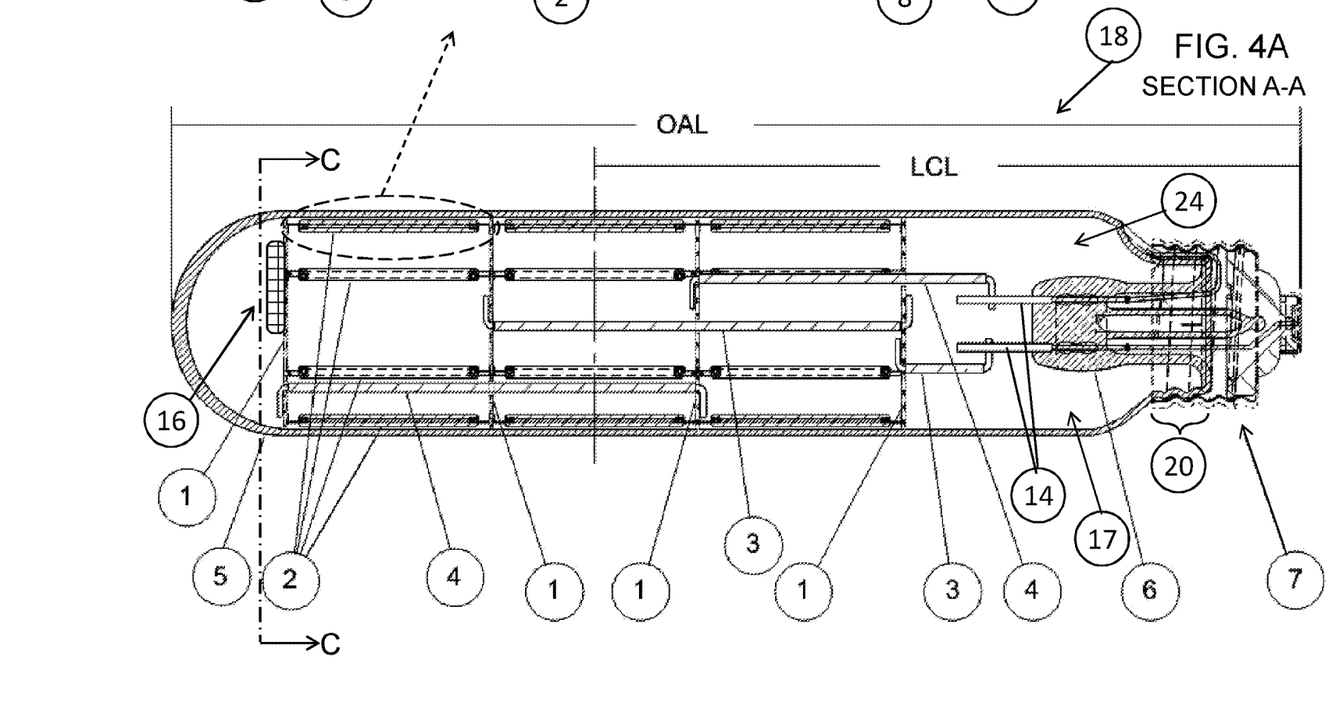
FIGS. 4A-4C are section view schematic drawings of a first embodiment of a filament LED lamp, having a disc type of end connector, according to the present invention.
Figure 4B:
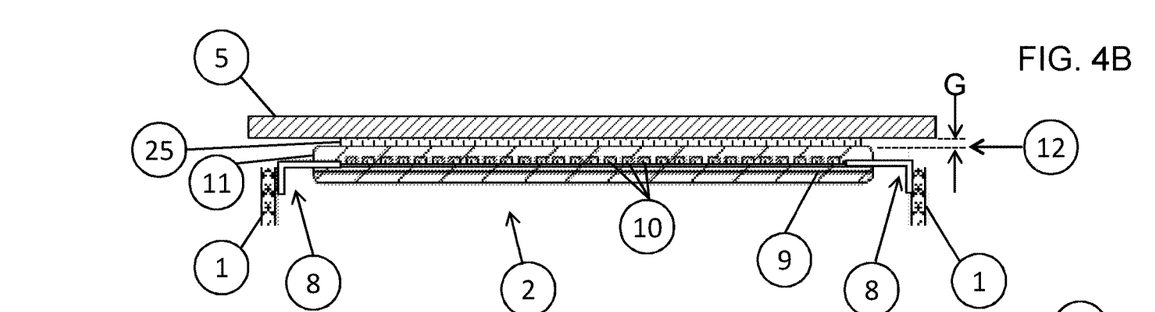

Referring particularly to the first and second embodiment side sectional views in FIGS. 4A and 7A, cooling is enhanced (maximized) by mounting the long narrow LED filaments 2 on a mount structure 24 that holds them in a longitudinal (axially aligned) orientation in a cylindrical (ring-like) arrangement inside a tubular (e.g., "T bulb") lamp jacket/bulb 5 wherein the length of the filament's encapsulant 11 (i.e., the outer surface of the LED filament 2) is held as close as possible to, ideally contacting, the inside wall of the bulb 5, thereby to maximize thermal transport from LEDs to, and out through, the bulb wall for dispersion in the ambient surroundings. Preferably the LED filaments 2 are oriented with the LED chips 10 facing outward, i.e., the filament's Z direction is aligned with the bulb's radial direction In other words, the outward facing (top) surface of the filaments 2 (e.g., the silicone encapsulant 11 over the LED chips 10) is held as close as possible to an inside surface of the bulb 5 (e.g., separated by a gap 12 with dimension G of zero (touching) to a maximum of three millimeters (3 mm); preferably less than 2 mm; most preferably touching (0 mm), along the entire length of the LED chip-containing portion (lighted length LL) of the LED filament 2. The gap 12 with dimension G is illustrated in FIGS. 4B-4C and 7A-7C, but FIGS. 4C and 7C best illustrate a gap 12 with separation G equal to zero (i.e., touching). FIG. 4B shows a way to enhance cooling across a non-zero gap 12 by filling it in with a thermally conductive material 25 such as, for example, silicone oil. However, even without such a filling, thermal conductivity of the fill gas is maximized by minimizing the length of the conductive path.

FIG. 7B may help clarify the meaning of a gap 12 dimension G that is limited to being "zero to three millimeters maximum". The drawing shows different size gaps 12 between different filaments 2 and the bulb wall 5. Regardless of geometry, our invention requires that none of the gaps exceeds 3 mm, and in the best (ideal) case all gaps are zero. For the perfectly circular geometry shown, the bulb has an inside diameter of dimension ID, and the mount structure 24 has an outside diameter shown as dimension D', the mount structure diameter D, D' being measured to the outermost surface of the LED filaments 2 which is the encapsulant protruding above/outward of the LED chips 10. Thus the invention requirement becomes that the diameter difference (ID minus D') is a maximum of 3 mm, which may mean an average gap of 1.5 mm (maximum), or zero on one side and a maximum of 3 mm on the opposite side if completely off center.

Preferably the LED chips 10 of the LED filament 2 are oriented to face outward (radially) in order to minimize the distance between the bulb wall 5 and the heat generating emitters of the LED chips 10. (FIG. 3 shows the LED 10 facing outward in the Z direction away from the substrate 9.)

Other Aspects, Highlighted

Figure 4C:
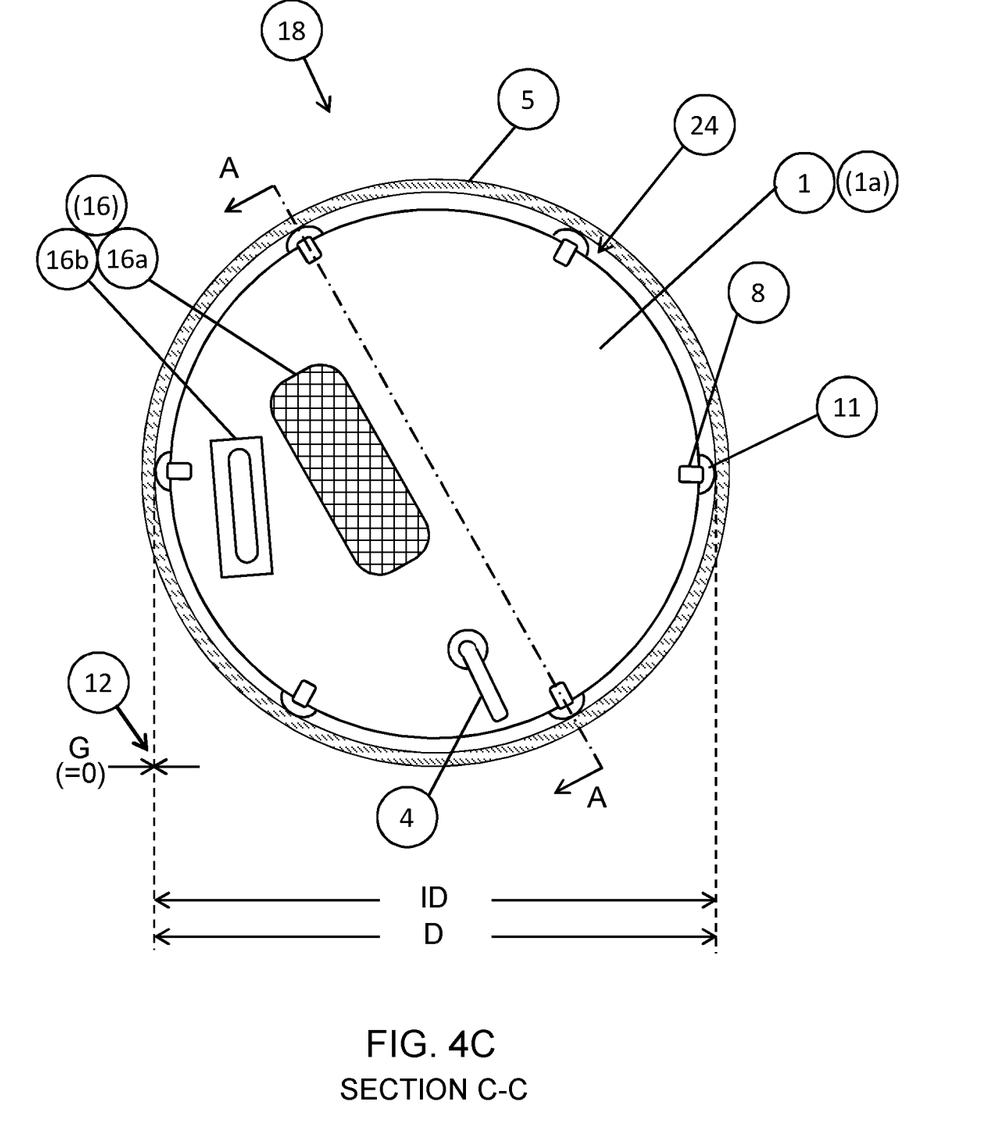

As shown in FIGS. 4A, 4C and 7A, each filament LED strip 2 is electrically and mechanically connected (e.g., by welding) between two end connector 1 parts of the mount structure 24. The end connectors 1 may be in the form of a disc (1a) as in the first embodiment (FIGS. 4-6), or a ring (1b) as in the second embodiment (FIGS. 7A-7C).

Further LED cooling enhancements are detailed hereinbelow, and preferably include the bulb 5 being hermetically sealed 20 and filled with a high thermal transmission cooling gas (high cooling rate gas): preferably pure helium gas, or pure hydrogen gas, or a mixture of the two.

Furthermore, LED deterioration in a sealed bulb 5 is controlled by use of at least one contaminant cleaner 16 inside the bulb and comprising an oxygen dispenser (16*b*) configured to emit oxygen gas when heated above a triggering temperature. Preferably an absorption getter (16*a*) is also included. Preferably the cleaner(s) 16, especially the oxygen dispenser 16*b*, are mounted where it will be heated above its trigger temperature by the LEDs 2 when operating, but not by the heat from forming the fused glass lamp seal 20 (which occurs before evacuation, flushing and gas filling). For example, referring to FIGS. 4C and 7B, the cleaner(s) 16 are located at the top of the lamp 18, farthest away from the base end sealing area 20, and generally where it will be heated by conductive and convective thermal transfer from operating LEDs. A heat shield 23 (FIG. 7A) may be used to further block heat from the sealing process.

Figures 5, 6:
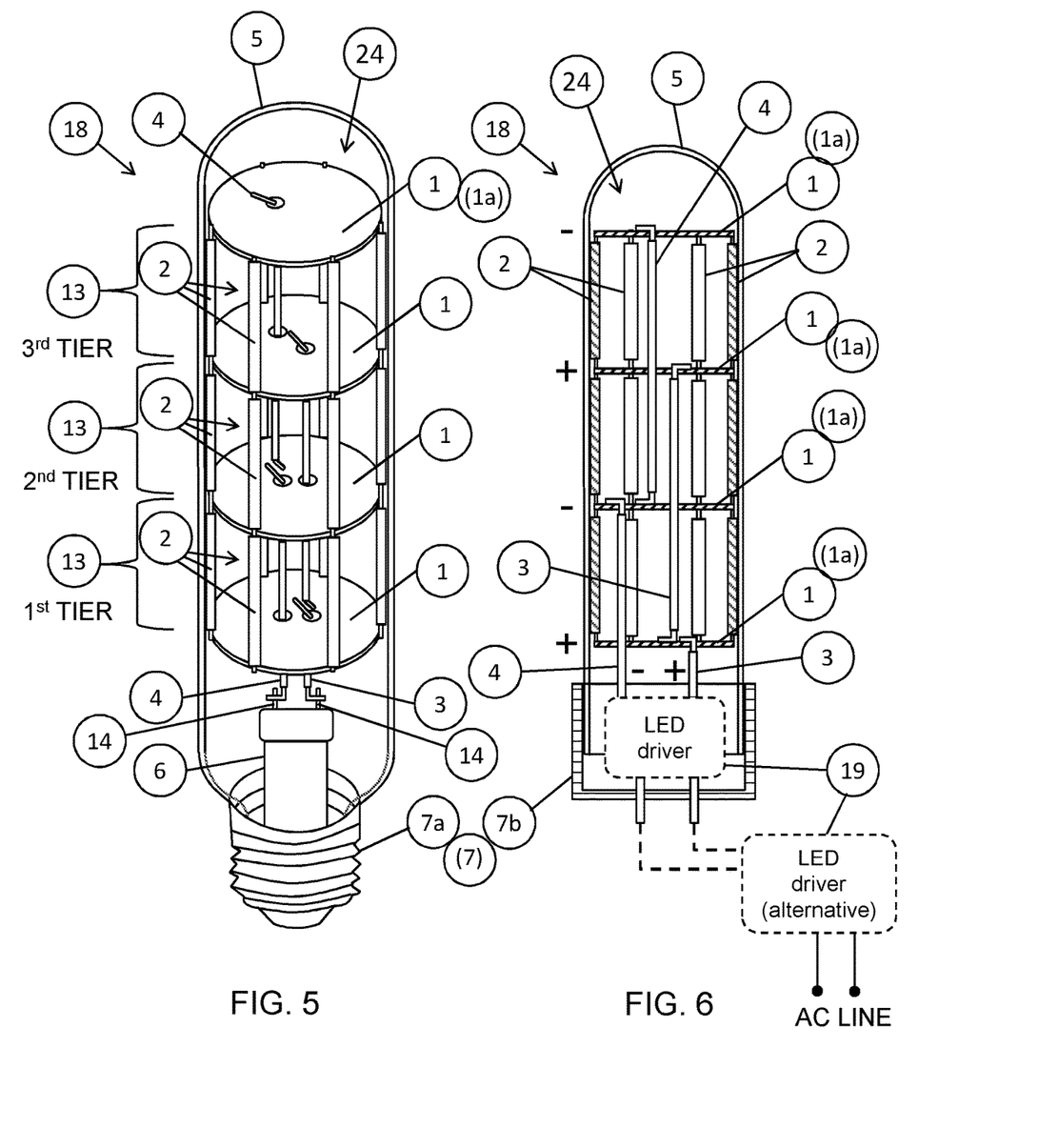
FIGS. 5 and 6 are perspective and side sectional views, respectively, schematically showing component arrangements and interconnections for examples of the lamp embodiment of FIGS. 4A-4C, all according to the present invention.

Referring to FIGS. 5-6, although the hermetic seal is typically fused glass 20 covered by a base 7 (e.g., screw cap 7*a*) an optional variation is shown in FIG. 6 wherein a collar or cap type of base 7*b* (optionally non-metallic) may be adhered over an open end of the tubular bulb 5, e.g., using a silicone sealant. If this type of seal is not hermetic, then the lamp may be air filled and the cleaner 16 may be primarily a porous package (e.g., a bag) that may hold zeolites, desiccant, and other known lamp gettering materials. This is a less preferred embodiment if it cannot utilize the enhanced cooling effects of high cooling rate gas fills such as hydrogen and/or helium, although air fill may be adequate in versions where direct thermal conduction from filament to bulb wall is assured by zero dimensioned gaps 12 and/or gaps 12 filled with a thermally conductive material 25.

As indicated in FIGS. 6 and 7A a suitable LED driver 19 is placed according to convenience and with suitable consideration given to dissipation of heat that may be generated by the driver. For example, the driver 19 may be separate from the lamp 18 and feeding driver-controlled current to the lamp via electrical connections in a socket or the like. Preferably the driver 19 may be built into the lamp 18, e.g., in the lamp base 7; or it could be mounted on an end connector 1 (e.g., disc 1*a*), etc.

It may be noted that LED filament lamps can be made using LED filaments 2 that have either an opaque or a light transmitting substrate 9. A determining factor for our lamp design may be the spacing of filaments around the cylindrical/ring arrangement. If closely spaced, then opaque substrates may be best for maximizing the amount of light projected outward from the lamp in a reasonably uniform pattern due to significantly overlapping beam patterns. If not closely spaced then tests and/or calculations may be needed to optimize output—at some point the transparent substrate will become useful due to light emitted inward crossing over to project outward through the gaps between filaments on the opposite side. Note that these considerations are limited by our design to LED filaments 2 that are oriented with the LED chips 10 facing outward (radially) for optimum cooling effect by proximity to the bulb wall 5.

Other details are provided hereinbelow, after description of two major embodiments. Both embodiments incorporate design components that maximize LED cooling by providing enhanced means of thermal transport to the bulb (outer jacket) of the lamp, as generally described above. The main difference between the embodiments is the physical structure of the end connectors 2 and the potential methods for enhancing cooling that are associated with each one. The other component and construction variations could be applied to either version as will become apparent from the description herein of components, concepts and methods of the present invention. For example, either end connector 2*a*, 2*b* could be used to implement single or multiple tiers.

First Embodiment: Disc Type End Connectors

FIGS. 4A-4C are section view schematic drawings of a first embodiment of a filament LED lamp 18, primarily distinguished by having a disc type (1*a*) of end connector 1. FIG. 4A is a vertical/longitudinal section taken on the line A-A shown in FIG. 4C, which in turn is a top view of section C-C as indicated in FIG. 4A. The FIG. 4B is a magnified view of the circled portion of FIG. 4A.

FIG. 4C shows that the mount structure 24 uses the disc type end connector 1*a* to form the ring of LED filaments 2 that are attached by welding their end pins 8 (e.g., flat tabs that are bent over the top of the disc) around the disc perimeter. The disc 1*a* is sized to position the outer surface of the filaments 2 at a mount structure outer diameter (D) that is no more than 3 mm smaller than the inside diameter (ID) of the bulb 5. Most preferably D is equal to ID so that the LED filaments are touching (i.e., separated by a gap 12 of G equals zero) as illustrated.

FIGS. 5-6 illustrate overall electrical connections and associated circuitry and components for filament LED lamps 18, particularly showing them implemented in the first embodiment version. FIG. 5 is a perspective view of a lamp 18 made with a fused glass hermetic seal 20 and a screw cap base 7*a*, and FIG. 6 is a sectional view of a lamp 18 with a collar type base 7*b* adhered to the straight sided open end ("bottom") of the T-bulb 5.

In the illustrated example, a predetermined quantity (e.g., six) of the LED filaments 2 are uniformly spaced apart around the perimeter of the bulb 5 inner wall to form a tier 13, and additional tiers 13 are stacked.

A conductive disc, e.g., metal, forms an end connector 1 (disc type end connector 1*a*) placed at top and bottom of each tier 13 to provide electrical and mechanical connection/attachment for connection tabs 8 at the ends of the LED filaments 2, therefor each tier comprises a set of electrically parallel-connected filaments 2.

In the illustrated embodiment, the tiers 13 are all connected in parallel, thereby making a parallel connection for all of the filament LEDs 2. (FIG. 6 shows that a positive connecting wire 3 connects the positive discs 1*a* to each other and to the positive output of the driver 19; and similarly a negative connecting wire 4 connects the negative discs 1*a* to each other and to the negative driver output.)

The discs 1*a* (end connectors 1) may be thermally conductive to conduct heat around the perimeter, and/or to spread it out across the entire disc area. Optionally, the discs 1*a* may be formed in a way that enhances convective cooling to supplement the conductive cooling by filament contact at the bulb wall (e.g., providing heat sinking fins, not shown).

The discs 1*a* are preferably aluminum which is light weight, and both thermally and electrically conductive, or a more springy metal may be used to achieve a compressible-diameter end connector 1 (using a sector cutout 24).

The end connector disc 1*a* may have a matt or shiny surface, and may be anodized or given a white aluminum oxide coating that may be glossy. These and other surface treatments may be implemented as ways to enhance lamp performance including, for example, heat dissipation, light reflection, radiant output spectrum and flux distribution, radiant flux directional control (reducing output in axial directions), and the like.

Connecting wires 3, 4 are used to connect suitable end connector (discs) 1 to the positive and negative leads from a driver 19. Insulated wires may be used to avoid electrical contact when the wire passes through a disc (e.g., a through-hole).

In this way, any number of tiers 13 may be connected in parallel electrically (i.e., all filaments are electrically parallel), and/or in series (tiers connected in series to each other). Or, for example, two stacked tiers 13 may be connected as a serially connected pair, and the pair could be connected in parallel to another serially connected pair. Other combinations may also be made as desired.

FIG. 4C shows a zero-dimensioned gap 12 (separation G=0) that is achieved using the disc type end connector 1a (compare FIG. 7C showing this for a ring type of end connector 1b). It is desirable to make the mount diameter D resilient and/or adjustable (compressible) in order to adjust for variations in the bulb ID (either overall or surface irregularities), and to ease insertion of the mount structure 24 as it is pushed into the bulb 5. Means and method for accomplishing this with either type of end connector 1 (1a, 1b) are detailed in the thermal transport section hereinbelow.

Second Embodiment: Ring Type End Connectors

FIGS. 7A-7C section view schematic drawings of another example embodiment of a filament LED lamp 18 primarily distinguished by having a ring type (1b) of end connector 1. FIG. 7A is a vertical/longitudinal section like the view of FIG. 4A, and FIGS. 7B-7C are top sectional views like the view of FIG. 4C.

FIGS. 7B-7C show that the mount structure 24 uses the ring type end connector 1b to form the ring of LED filaments 2 that are attached by welding their end pin tabs 8 around the ring perimeter. The ring 1b is sized to position the outer surface of the filaments 2 at a mount structure outer diameter (D, D') that is no more than 3 mm smaller than the inside diameter (ID) of the bulb 5. Most preferably mount diameter D is equal to the bulb ID so that the LED filaments 2 are touching (i.e., separated by a gap 12 of G equals zero) as illustrated in FIG. 7C.

As noted above, other aspects illustrated in FIGS. 4A-6 can be adapted for use with the ring type 1b end connector 1 in place of the disc type 1a, and vice versa for aspects of the second embodiment illustrated in FIGS. 7A-7C. For example, FIG. 7A shows a driver 19 built into the lamp base 7 (as in FIG. 6). For example, the contaminant cleaner(s) 16 (16a, 16b) may be mounted in the top of the lamp 18 by attachment to support wires 21 (as in FIG. 7A) or directly to the end connector 1 (e.g., disc 1a as in FIG. 4C). For example, electrical connecting wires 3, 4 are attached between stem leads 14 and end connectors 1; and may also be used to hold the mount structure 24 above the stem 6 (at least the lower end connector 1 as in FIGS. 4A and 7A).

FIGS. 7B-7C particularly illustrate an optional but desirable feature wherein the end connectors 1 may be modified to make the mount structure diameter D variable/adjustable (preferably resiliently) in order to adjust for variations in the bulb ID (either overall or surface irregularities), and to ease insertion of the mount structure 24 as it is pushed into the bulb. In particular, the end connector 1 has a cutout portion 24 of the perimeter so that the diameter can be compressed to a dimension D' which is less than the bulb ID by bending the end connector 1 (and one or more connecting wires 21 if present) to the position shown in FIG. 7B (and also shown with dashed lines in FIG. 7C), which should be easy to push into the bulb 5. Although not illustrated, it is apparent that an equivalent cut-out portion 26 for the disc type end connector 1a is a sector, and compression (mount diameter D reduction) can be accomplished by bending the flat disc into a cone shape. For either type of end connector 1, use of a resilient material will provide a diameter increasing bias force such that the end connector 1 could be compressed to a smaller mount diameter D' for easy insertion into the bulb 5 (as in FIG. 7B) followed by allowing the end connectors 1 to expand to a mount diameter D equal to the bulb ID (as in FIG. 7C).

Further details about the methods and design elements used to enhance heat transmission are presented in the Thermal Transport section hereinbelow.

More about Lamp Filling

As best shown in FIGS. 4A, 4C, 7A and 7B, preferably the bulb 5 is hermetically sealed 20 and filled with a high percentage of a high convection cooling gas 17, preferably pure helium gas (He), optionally pure hydrogen gas (H2) or a mixture of helium and hydrogen (He/H2).

Preferably contaminant cleaning materials 16 are sealed into the lamp to minimize damage to components due to contaminants inside the finished (sealed) and operating lamp. Cleaners 16 (generally called getters) are positioned for activation by heat from LED operation but not from the lampmaking process (e.g., fused glass sealing 20). There are two cleaner 16 embodiments illustrated, designated 16a and 16b.

Standard lampmaking absorption getters (16a) are for sorbing and holding active gases such as oxygen, carbon dioxide/monoxide (COx), water, and hydrocarbons such as VOCs (volatile organic compounds). In FIG. 4C a simple version shows a porous package (e.g., a bag) that may hold zeolites, desiccant, and other known lamp gettering materials. The bag form is most appropriate for an air filled, non-hermetic sealed lamp, but preferred lamp 18 embodiments are hermetically sealed and filled with a high cooling rate gas; in which case the absorption getter 16a may be a metal tablet filled with a special getter alloy, e.g., Saes DF tablets, particularly those using alloys with lower activation temperatures such as St787 or St777P alloys that can be activated by 350 C heating and will function at operating temperatures as low as 300 C.

An oxygen dispenser 16b (a particular type of active chemical getter) is preferably used in combination with the absorption getter 16a to eliminate organic materials (e.g., VOCs) that may be present in the hermetically sealed LED lamps 18 (e.g., emitted from the LED components and/or lamp making processes). For example, Saes Oxygen Dispensers OXD/LN/20-3.5/10 or /38 comprise a metal flag holding an oxide that emits oxygen gas when heated above a triggering temperature by LED operation. The oxygen reacts with organics to produce COx which can be sorbed by the absorption getter 16a.

Per Saes literature: "The Oxygen Dispenser is mounted in a location that will operate at 350° C. Baking of the lamp at 200° C. will not cause a decrease of the oxygen yield. The average filling weights of 10 and 38 mg yield about 0.5 and 1.2 millibar-liter of oxygen, respectively. The Oxygen Dispenser releases its oxygen shortly after the lamp is turned on. Once released, the oxygen reacts with carbon on the hot arc tube to form CO and CO2. Both of these are sorbed by the Strip or DF getter [absorption getter 16a] in the lamp jacket."

A heat shield 23, and/or an extra long stem 6 as shown in FIG. 7A may be utilized to shield the getters 16 and the filament LEDs 2 from higher temperature effects of fused glass sealing 20. Also note that, because the filament LED strings are very close, if not directly touching the bulb 5, we may use soda lime glass (lower melting point than hard glass) to lower the bulb wall temperature during the fused glass sealing process. First production has been with borosilicate glass bulbs and stems (hard glass), mainly because large diameter (30 mm or more) tubular bulbs made with soda lime glass were not generally available. Hard glass is not required due to the much lower temperatures produced by LED light sources.

More about Thermal Transport

As stated above, the silicone LED encapsulant 11 preferably contacts the inside wall of the lamp bulb/jacket 5 to maximize the thermal conductivity for heat transmission from the LEDs (i.e., LED chips) 10 outward to and through the bulb wall 5 for dispersion in the ambient surroundings. As illustrated in FIGS. 4C and 7C, the contact may be implemented by physically positioning the LED filament 2 such that the encapsulant 11 protrudes outward of the end connector 1 perimeter to a diameter D that closely matches the inside diameter ID of the bulb wall 5, thereby achieving a filament-to-bulb gap 12 that is as close as possible to a separation dimension G of zero.

FIG. 4C shows an ideal zero-dimensioned gap 12 (G=0) that is achieved using the disc type end connector 1a, and FIG. 7C shows this for a ring type end connector 1b. It is desirable to make the mount diameter D adjustable (compressible/contractible), preferably resiliently, in order to adjust for variations in the bulb ID (either overall or surface irregularities), and to ease insertion of the mount structure 24 as it is pushed into the bulb 5. Bulb ID decreases are particularly problematic because they may damage filaments 2 due to friction and/or inelastic bending. Lubrication (e.g., silicone oil, or other such material that may also be used as a thermally conductive transitional component 25) may be used to reduce friction and also to fill gaps due to bulb ID variation, but only small ID decreases can be accommodated by encapsulant compression and/or elastic flexing of the substrate 9 and end tabs 8. For better adjustability, the end connectors 1 may be made resiliently compressible (diametrically).

FIGS. 7B-7C show a method for modifying the end connectors 1 to make them compressible (variable mount structure 24 diameter D) by making a cut out portion 26 so that the diameter can be compressed to a dimension D' which is less than the bulb ID by bending the end connector 1 (and one or more connecting wires 21 if present) to the position shown in FIG. 7B (and also shown with dashed lines in FIG. 7C), which should be easy to push into the bulb 5. For the ring type end connector 1b this is shown as a missing (i.e., cut out) portion 26 of the perimeter. Although not illustrated, it is apparent that an equivalent cut out portion 26 for the disc type end connector 1a is a sector, and compression (mount diameter D reduction) can be accomplished by bending the flat disc into a cone shape. For either type of end connector 1, use of a resilient material will provide a diameter increasing bias force such that the end connector 1 could be compressed to a smaller mount diameter D' for easy insertion into the bulb 5 (as in FIG. 7B for the ring end connector labeled 1b) followed by allowing the end connectors 1 to expand until the LED filaments 2 are all touching the bulb wall as shown in FIG. 7C (for the ring end connector labeled 1b'), thereby achieving the desired zero-dimension separation/gap 12 everywhere, i.e., the mount diameter D is equal to the bulb's inside diameter ID. If the end connector's uncompressed diameter is made slightly oversize, i.e., D greater than nominal bulb ID, then a zero dimension G gap 12 could be assured for all bulb ID variations (within expected tolerances of course).

Preferably the end connector 1 and/or the supporting wire(s) 21 are resiliently flexible and biased to a relaxed position where mount diameter D is optimally sized to accommodate expected variations in bulb ID. There can be more than one cutout 26, in which case resilience of the connecting wires 21 may be used to provide the expanding bias force. Instead of resilience, the connecting wires 21 could be arranged as lever arms for constricting the ring by pushing on the stem and support rod 22, and then expanding the ring by pulling back on the stem/support rod.

Regarding insertion: in the FIG. 7A embodiment, the top end connector 1 (1b) is substantially supported by a support rod 22 extending up from the stem 6, the rod being attached by connecting wires 21 to the end connector 1. The bottom end connector 1 is preferably more flexibly connected to the stem 6, e.g., by using an electrical connecting wire 3, that is more supple than the connecting wires 21. This arrangement eases pushing the mount structure 24 into the bulb even when close proximity causes frictional drag on the filament encapsulant 11. The firm top connection and rigid support rod 22 are used to push on the mount's top end which is above the friction points, so the ring of filaments 2 is effectively pulled up into the bulb 5, with the bottom end self centering regardless of stem centering. This prevents wrinkling of the filaments that might happen if the mount structure 24 is pushed by the bottom end connector 1 when the filaments 2 are the most rigid supports for the top of the mount structure (as in FIG. 4A, unless the electrical connecting wires 3, 4 are more rigid than the filaments). The advantages of the second embodiment design (with ring type end connectors 1b) may be implemented in the first embodiment (with disc type end connectors 1a) by, for example, extending a support rod 22 from the stem 6 up to the top end connector disc 1a, passing through holes in intermediate end connector discs 1a.

For either type of end connector 1, the force of pushing (or twisting) the connector 1 can be used to cause diameter compression (e.g., pushing the connecting wires 21 or center of disc bends them upward which shortens the radial distance to the end connector perimeter, thereby reducing the circumference along with the diameter).

Alternatives for Zero Separation Benefits

Other ways to implement the maximized thermal conductivity of a zero separation (direct contact) of filament to bulb include the following:

Physically and/or chemically bond the filament LED to the bulb wall to maximize thermal conductivity. This may also minimize Fresnel losses of the LED radiant output. Example bonding methods include:

Oxygen plasma treating the glass inside bulb wall 5, and then placing the LED filament's silicone encapsulation 11 in contact with the treated glass surface. By the heat from a fused glass sealing process, filament LEDs are bonded chemically with glass of the bulb 5.

Alternatively, apply uncured silicone on at least the radially outward surface of the filament LEDs 2 after they are attached to the mounting/support structure end connectors 1, thereby filling the gap G of area 12 between the filament LED and the bulb inner wall with silicone 25 (as in FIG. 4B). Then cure the silicone coating, for example by heat from a lamp sealing process, or by UV, or by other thermal or radiation processes. This provides a transitional component 25 of thermally conductive material equivalent to continuing the encapsulant 11 into the most intimate contact with the bulb that is provided by bonding, thereby maximizing thermal conductivity. It may be even better than bonding because even when the encapsulant is pressed against the glass for a nominal zero-dimensioned gap, the typically rounded encapsulant surface will still have small gaps where the curvature is tighter than the bulb radius of curvature. The transitional component 25 should fill those gaps to make for a wider area of contact.

Rather than bonding, a slightly less conductive contact may be achieved by providing a highly conductive transitional component 25 such as silicone oil, which also fills air gaps.

Example Lamps

Example embodiments of a high output LED lamp made according to the present invention have the following approximate specs:
multi-tier (FIG. 4A) T-37.5 mm bulb (OD), 189 mm OAL, 118 mm LCL, 2500 lumens, 23 W not including driver, using 18 SOLERIQ L38 LED filaments.
single tier (FIG. 7A) T-50 or 55 mm bulb (OD), 230 mm OAL, 150 mm LCL, 3200 lumens, 25 W total (including driver in base), using 8 or 10 LED filaments (each having a 5×120 mm PCA substrate with 2 parallel rows of 50 interconnected LED chips)

Compare these to the prior art filament LED lamps (FIG. 1) which are "low output", i.e., only about 4 W, 440 lumens using 4 SOLERIQ L38s situated relatively far from the bulb.

Although the invention has been illustrated and described in detail in the drawings and foregoing description, the same is to be considered as illustrative and not restrictive in character—it being understood that the embodiments shown and described have been selected as representative examples including presently preferred embodiments plus others indicative of the nature of changes and modifications that come within the spirit of the invention(s) being disclosed and within the scope of invention(s) as claimed in this and any other applications that incorporate relevant portions of the present disclosure for support of those claims. Undoubtedly, other "variations" based on the teachings set forth herein will occur to one having ordinary skill in the art to which the present invention most nearly pertains, and such variations are intended to be within the scope of the present disclosure and of any claims to invention supported by said disclosure.

What is claimed is:

1. A high output filament LED lamp having a longitudinally extended bulb, the lamp comprising:
    LED filaments being an elongated narrow substrate with a plurality of closely spaced interconnected LED chips, encapsulated in a material providing an outer surface over the LED chips; and
    the bulb being tubular and containing a mount structure comprising at least two longitudinally separated end connectors, and a plurality of longitudinally extended LED filaments electrically and mechanically connected therebetween and spaced apart around a perimeter thereof such that the mount structure perimeter defined by the outer surfaces of the LED filaments is held adjacent to an inner surface of the bulb, and separated by a total diameter difference gap of substantially zero to three millimeters maximum.

2. The filament LED lamp of claim 1, further comprising:
    the bulb being filled with a cooling gas substantially consisting of pure helium gas, or pure hydrogen gas, or a mixture thereof, and
    a contaminant cleaner inside the bulb comprising an oxygen dispenser configured to emit oxygen gas when heated above a triggering temperature.

3. The filament LED lamp of claim 2, wherein:
    the contaminant cleaner is mounted on a top one of the end connectors.

4. The filament LED lamp of claim 2, wherein:
    the contaminant cleaner further comprises an absorption getter.

5. The filament LED lamp of claim 1, wherein:
    the total gap is less than about 2 mm.

6. The filament LED lamp of claim 1, wherein:
    the total gap is less than about 1 mm.

7. The filament LED lamp of claim 1, wherein:
    the total gap is substantially zero.

8. The filament LED lamp of claim 1, wherein:
    the end connector is a ring or a disc shape.

9. The filament LED lamp of claim 1, wherein:
    the end connector is resiliently flexible and has a cut out portion of its perimeter.

10. The filament LED lamp of claim 1, further comprising:
    a rigid support rod longitudinally extending from a lamp stem to a top one of the end connectors.

11. The filament LED lamp of claim 1, wherein:
    the LED chips face radially outward.

12. The filament LED lamp of claim 1, wherein:
    a thermally conductive non-gaseous material fills gaps between LED filaments and the bulb wall.

13. The filament LED lamp of claim 1, wherein:
    the encapsulant is bonded to the bulb wall.

14. The filament LED lamp of claim 1, further comprising:
    a heat shield provided between a fused glass seal and the mount structure.

15. The filament LED lamp of claim 1, further comprising:
    an LED driver provided in a lamp base.

16. A high output filament LED lamp having a longitudinally extended bulb, the lamp comprising:
    LED filaments being an elongated narrow substrate with a plurality of closely spaced interconnected LED chips, encapsulated in a material providing an outer surface over the LED chips; and
    the bulb being tubular and containing a mount structure comprising at least two longitudinally separated end connectors, and a plurality of longitudinally extended LED filaments electrically and mechanically connected therebetween and spaced apart around a perimeter thereof such that the mount structure perimeter defined by the outer surfaces of the LED filaments is held substantially in contact with an inner surface of the bulb;
    wherein the end connectors are a ring or a disc shape with a cut out portion such that the mount structure is resiliently compressible diametrically for pressing the LED filaments against the bulb wall.

17. The filament LED lamp of claim 16, further comprising:
    a rigid support rod longitudinally extending from a lamp stem to a top one of the end connectors and configured for pushing on the end connector to cause compression of the mount structure diameter during mount insertion into the bulb.

18. The filament LED lamp of claim 16, further comprising:
    a silicone oil on the outer surface of the LED filaments.

19. The filament LED lamp of claim 16, further comprising:
- the bulb being filled with a cooling gas substantially consisting of pure helium gas, or pure hydrogen gas, or a mixture thereof, and
- a contaminant cleaner inside the bulb comprising an oxygen dispenser configured to emit oxygen gas when heated above a triggering temperature.

20. The filament LED lamp of claim 19, wherein:
the contaminant cleaner further comprises an absorption getter.

\* \* \* \* \*